(12) United States Patent
Lee et al.

(10) Patent No.: US 9,659,833 B2
(45) Date of Patent: May 23, 2017

(54) SEMICONDUCTOR PACKAGES, METHODS OF MANUFACTURING THE SAME, ELECTRONIC SYSTEMS INCLUDING THE SAME, AND MEMORY CARDS INCLUDING THE SAME

(71) Applicant: SK hynix Inc., Icheon-si, Gyeonggi-do (KR)

(72) Inventors: Dae Woong Lee, Yongin-si (KR); Tae Min Kang, Seoul (KR); Han Jun Bae, Seoul (KR)

(73) Assignee: SK hynix Inc., Icheon-Si (KR)

( * ) Notice: Subject to any disclaimer, the term of this patent is extended or adjusted under 35 U.S.C. 154(b) by 26 days.

(21) Appl. No.: 14/808,596

(22) Filed: Jul. 24, 2015

(65) Prior Publication Data
US 2016/0211188 A1    Jul. 21, 2016

(30) Foreign Application Priority Data
Jan. 16, 2015   (KR) .................. 10-2015-0008221

(51) Int. Cl.
*H01L 23/29*    (2006.01)
*H01L 23/00*    (2006.01)
(Continued)

(52) U.S. Cl.
CPC .......... *H01L 23/293* (2013.01); *H01L 21/563* (2013.01); *H01L 23/296* (2013.01); *H01L 23/3142* (2013.01); *H01L 24/32* (2013.01); *H01L 24/83* (2013.01); *H01L 2224/04042* (2013.01); *H01L 2224/26145* (2013.01); *H01L 2224/32225* (2013.01); *H01L 2224/45139* (2013.01); *H01L 2224/45144* (2013.01); *H01L 2224/45147* (2013.01); *H01L 2224/48091* (2013.01); *H01L 2224/73265* (2013.01); *H01L 2224/83192* (2013.01); *H01L 2224/83855* (2013.01); *H01L 2224/92247* (2013.01); *H01L 2924/06* (2013.01); *H01L 2924/0665* (2013.01); *H01L 2924/181* (2013.01); *H01L 2924/182* (2013.01); *H01L 2924/186* (2013.01)

(58) Field of Classification Search
CPC .............................. H01L 21/563; H01L 24/83
See application file for complete search history.

(56) References Cited

U.S. PATENT DOCUMENTS

| 8,159,067 B2* | 4/2012 | Daubenspeck ....... H01L 21/563 257/738 |
| 2015/0318232 A1* | 11/2015 | Wu .................... H01L 23/3107 257/675 |

FOREIGN PATENT DOCUMENTS

| KR | 1020050053751 A | 6/2005 |
| KR | 20120061712 A | 6/2012 |

* cited by examiner

*Primary Examiner* — Matthew Landau
*Assistant Examiner* — Krista Soderholm
(74) *Attorney, Agent, or Firm* — William Park & Associates Ltd.

(57) ABSTRACT

A semiconductor package includes an adhesive member disposed on a package substrate to have a trapezoid cross-section view, and a semiconductor chip disposed on the adhesive member and attached to the package substrate by the adhesive member. The semiconductor chip has a first surface and a second surface facing the first surface, and the second surface of the semiconductor chip contacts the adhesive member. The semiconductor chip includes a tension supplement pattern attached to the second surface and spaced apart from the package substrate.

19 Claims, 12 Drawing Sheets

(51) Int. Cl.
*H01L 23/31* (2006.01)
*H01L 21/56* (2006.01)

SEMICONDUCTOR PACKAGES, METHODS OF MANUFACTURING THE SAME, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Application No. 10-2015-0008221, filed on Jan. 16, 2015, in the Korean intellectual property Office, which is incorporated herein by reference in its entirety as set forth in full.

BACKGROUND

1. Technical Field

Various embodiments of the invention relate to electronic device packages and, more particularly, to semiconductor packages and methods of manufacturing the same.

2. Related Art

Electronic devices employed in electronic systems may include various circuit elements, and the circuit elements may be integrated in and/or on a semiconductor substrate to constitute the electronic device (also, referred to as a semiconductor chip or a semiconductor die). The semiconductor chip (or the semiconductor die) may be attached to a package substrate and may be electrically connected to the package substrate using a wire bonding technique or a flip chip technique to provide a semiconductor package.

In a die-attaching process for mounting the semiconductor chip on the package substrate, an adhesive agent may be interposed between the semiconductor chip and the package substrate. The adhesive may be provided in a film form or a gel state.

SUMMARY

According to an embodiment, a semiconductor package includes an adhesive member disposed on a package substrate to have a trapezoid cross-section view. The semiconductor package also includes a semiconductor chip disposed on the adhesive member and attached to the package substrate by the adhesive member. The semiconductor chip has a first surface and a second surface facing the first surface, and the second surface of the semiconductor chip contacts the adhesive member. The semiconductor chip includes a tension supplement pattern attached to the second surface and spaced apart from the package substrate.

According to an embodiment, there is provided a method of manufacturing a semiconductor package. The method includes coating an adhesive material having flowability on a package substrate and disposing a semiconductor chip above the coated adhesive material. The semiconductor chip has a first surface and a second surface facing the first surface and a tension supplement pattern attached to the second surface thereof. The tension supplement pattern is brought into contact with the coated adhesive material to fill a space between the semiconductor chip and the package substrate with the coated adhesive material. The coated adhesive material is cured to fix the semiconductor chip to the package substrate.

According to an embodiment, there is provided a memory card including a package. The package includes an adhesive member disposed on a package substrate to have a trapezoid cross-section view. The package also includes a semiconductor chip disposed on the adhesive member and attached to the package substrate by the adhesive member. The semiconductor chip has a first surface and a second surface facing the first surface, and the second surface of the semiconductor chip contacts the adhesive member. The semiconductor chip includes a tension supplement pattern attached to the second surface and spaced apart from the package substrate.

According to an embodiment, there is provided an electronic system including a package. The package includes an adhesive member disposed on a package substrate to have a trapezoid cross-section view, and a semiconductor chip disposed on the adhesive member and attached to the package substrate by the adhesive member. The semiconductor chip has a first surface and a second surface facing the first surface, and the second surface of the semiconductor chip contacts the adhesive member. The semiconductor chip includes a tension supplement pattern attached to the second surface and spaced apart from the package substrate

DETAILED DESCRIPTION

In the following embodiments, it will be understood that when an element is referred to as being located "on", "over", "above", "under", "beneath" or "below" another element, it may directly contact the other element, or at least one intervening element may be present therebetween. Accordingly, the terms such as "on," "over," "above," "under," "beneath," "below" and the like that are used herein are for the purpose of describing particular embodiments only and are not intended to limit the scope of the invention.

In the figures, a thicknesses and length of components are exaggerated compared to actual physical thickness and intervals for convenience of illustration. In the following description, a detailed explanation of known related functions and constitutions may be omitted to avoid unnecessarily obscuring the subject manner. Furthermore, 'connected/coupled' represents that one component is directly electrically coupled to another component or indirectly electrically coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Figure 1:
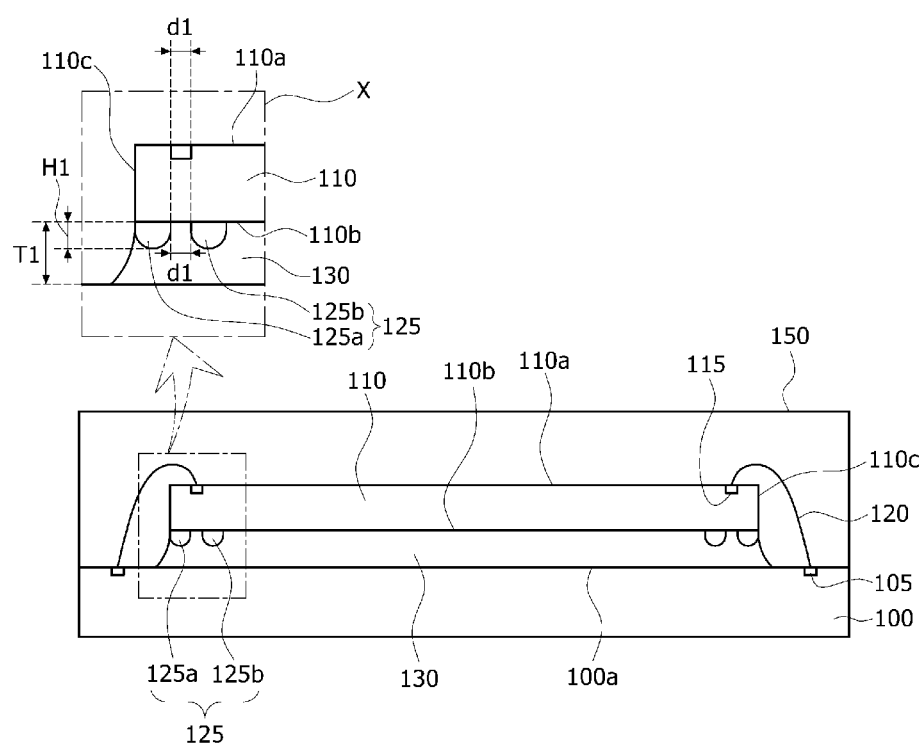
FIG. 1 illustrates a semiconductor package according to an embodiment.
Figure 2A:
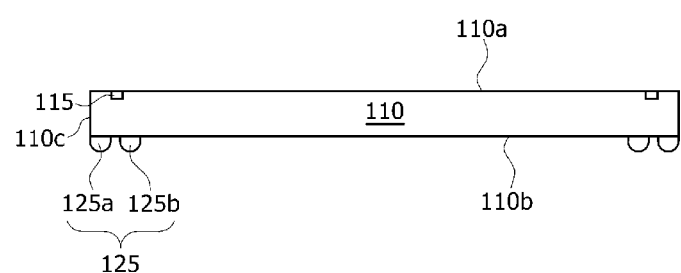
FIGS. 2A and 2B illustrate a semiconductor chip included in the semiconductor package of FIG. 1.
Figure 2B:
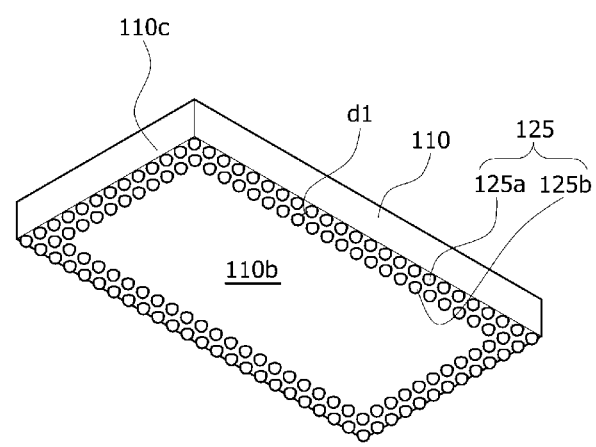
Figure 3:
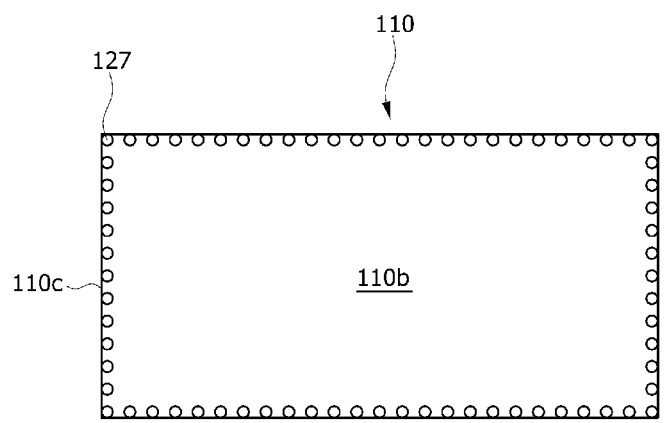
FIGS. 3, 4A and 4B are plan views illustrating semiconductor packages according to other embodiments.
Figure 4A:
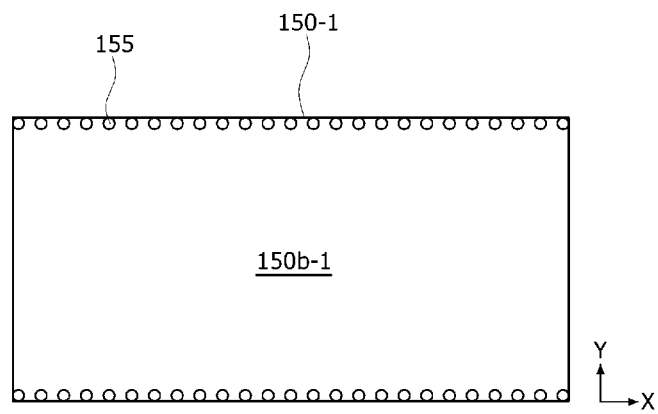
Figure 4B:
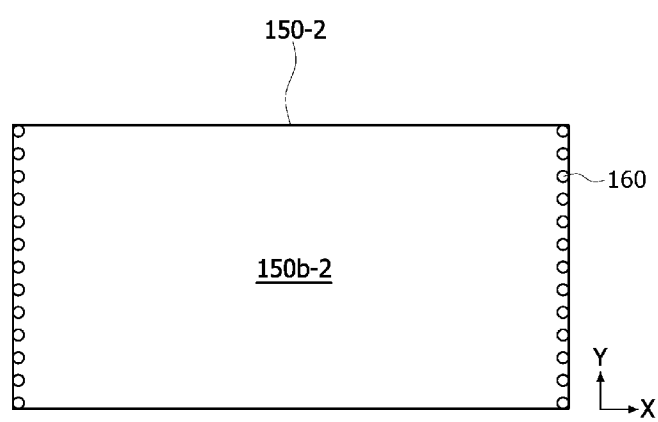

Referring to FIGS. 1, 2A and 2B, a semiconductor package according to an embodiment is illustrated. More specifically, FIGS. 2A and 2B illustrates a semiconductor chip 110 included in the semiconductor package of FIG. 1. In addition, FIGS. 3, 4A and 4B are bottom plan views of semiconductor chips included in semiconductor packages according to some embodiments.

Referring again to FIGS. 1, 2A and 2B, a semiconductor package according to an embodiment may include a package substrate 100, a semiconductor chip 110 disposed on the package substrate 100, and an adhesive member 130 disposed between the package substrate 100 and the semiconductor chip 110.

The package substrate 100 may be a substrate on which the semiconductor chip 110 can be mounted to constitute the semiconductor package. The package substrate 100 may include a plurality of circuit interconnection patterns disposed therein. In some embodiments, the package substrate 100 may be a printed circuit board (PCB). The package substrate 100 may include a plurality of substrate pads 105. The substrate pads 105 may be disposed on a top surface 100a of the package substrate 100. Although FIGS. 1, 2A and 2B illustrate an example in which the substrate pads 105 are arrayed on edges of the package substrate 100 and are spaced apart from each other, the invention is not limited thereto.

The semiconductor chip 110 may be mounted on the package substrate 100. The semiconductor chip 110 may be fixed to the package substrate 100 by the adhesive member 130. Wherein the adhesive member 130 may have a trapezoid cross-section view. The semiconductor chip 110 may have a first surface 110a and a second surface 110b facing the first surface 110a. The semiconductor chip 110 may be disposed on the package substrate 100 such that active regions of the semiconductor chip 110 is upwardly located. Accordingly, the first surface 110a of the semiconductor chip 110 may correspond to a front-side surface adjacent to the active regions. Further, the second surface 110b of the semiconductor chip 110 may correspond to a backside surface that faces the first surface 110a. The second surface 110b may also contact the adhesive member 130. The semiconductor chip 110 may be configured to include transistors and circuit patterns which are disposed to be adjacent to the first surface 110a. The transistors may include MOS transistors having gate electrodes and source/drain regions. In addition, the circuit patterns may include interconnection lines such as bit lines.

The semiconductor chip 110 may include a plurality of connection pads 115. Although FIG. 2 illustrates an example in which the connection pads 115 are disposed on edges of the semiconductor chip 110, the invention is not limited thereto. For example, in some embodiments, the connection pads 115 may be disposed on a central portion of the semiconductor chip 110. Each of the connection pads 115 may include an aluminum material or a copper material. The connection pads 115 may be electrically coupled to the substrate pads 105 through bonding wires 120. As a result, the semiconductor chip 110 may be electrically coupled to the package substrate 100 through the bonding wires 120.

The adhesive member 130 may be disposed between the package substrate 100 and the semiconductor chip 110 to fix the semiconductor chip 110 to the package substrate 100. The adhesive member 130 may be formed by coating an adhesive material having a gel state or a paste state and by curing the adhesive material. The adhesive material having a gel state or a paste state may spread toward the edges of the package substrate 100 because of the gravity. In such a case, a top surface area of the adhesive member 130 may be less than a bottom surface area of the adhesive member 130. A contact area between the semiconductor chip 110 and the adhesive member 130 may be less than a contact area between the package substrate 100 and the adhesive member 130. Accordingly, a lower edge portion of the adhesive member 130 may laterally protrude from an upper edge portion of the adhesive member 130 so that sidewalls of the adhesive member 130 have a tailed profile. Therefore, the adhesive member 130 may have sloped sidewalls. More specifically, each of the sloped sidewalls of the adhesive member 130 may exhibit a curved profile, for example, a concave profile. Accordingly, the adhesive member 130 may be formed to have a cross-sectional view similar to a trapezoid shape. The adhesive member 130 may include silicone resin or epoxy resin.

The semiconductor chip 110 includes tension supplement patterns 125 disposed on the second surface 110b of the semiconductor chip 110. The tension supplement patterns 125 may be produce addition surface tensions. Each of the tension supplement patterns 125 may be disposed to protrude from the second surface 110b of the semiconductor chip 110. Each of the tension supplement patterns 125 may have a hemispherical shape and may include a polymer material, for example, silicone resin or epoxy resin. The tension supplement patterns 125 may also be spaced apart from the package substrate 100.

Referring to an enlarged view of a portion "X" illustrated in FIG. 1, the tension supplement patterns 125 may be formed to have a first height H1 from the second surface 110b of the semiconductor chip 110. Further, the adhesive member 130 may be formed to have a first thickness T1. In such a case, the first height H1 may be less than the first thickness T1 so that the tension supplement patterns 125 do not contact the top surface 100a of the package substrate 100.

The tension supplement patterns 125 disposed on the second surface 110b of the semiconductor chip 110 may be arrayed along edges of the semiconductor chip 110. The tension supplement patterns 125 may be arrayed along four edges of semiconductor chip 110, as illustrated in FIG. 2(b). In some embodiments, the tension supplement patterns 125 may be arrayed in two lines along four edges of the semiconductor chip 110. In such a case, the tension supplement patterns 125 may include first tension supplement patterns 125a disposed outside and second tension supplement patterns 125b disposed inside. If the tension supplement patterns 125 are arrayed in two lines, the first tension supplement patterns 125a may be disposed to be spaced apart from the second tension supplement patterns 125b by a predetermined distance d1. The first tension supplement patterns 125a corresponding to outer tension supplement patterns 125a may be arrayed along the edges of the semiconductor chip 110 and may be vertically aligned with sidewalls 110c of the semiconductor chip 110. The first tension supplement patterns 125a may be disposed not to be out of the edges of the semiconductor chip 110.

In other embodiments, tension supplement patterns 127 may be arrayed in a single line along four edges of the second surface 110b of the semiconductor chip 110, as illustrated in FIG. 3. In such a case, the tension supplement patterns 127 may be disposed to be adjacent to the four sidewalls 110c of the semiconductor chip 110 and may be vertically aligned with the sidewalls 110c of the semiconductor chip 110.

In still other embodiments, tension supplement patterns 155 may be arrayed on only two opposite edges of a backside surface 150b-1 of a semiconductor chip 150-1. More specifically, referring to FIG. 4A, the tension supplement patterns 155 may be disposed on both edges of the backside surface 150b-1 of the semiconductor chip 150-1, which are located at both sides of a major axis that passes through a central point of the semiconductor chip 150-1 to be parallel with an X-axis. In such a case, the tension supplement patterns 155 may be arrayed in a single line or in two lines along the two opposite edges of the semiconductor chip 150-1. In the alternative, as illustrated in FIG. 4B, tension supplement patterns 160 may be arrayed on only two opposite edges of a backside surface 150b-2 of a semiconductor chip 150-2, which are located at both sides of a minor axis that passes through a central point of the semiconductor chip 150-2 to be parallel with a Y-axis. In such a case, the tension supplement patterns 160 may be arrayed in a single line or in two lines along the two opposite edges of the semiconductor chip 150-2.

The semiconductor chip 110 may be electrically coupled to the package substrate 100 through the bonding wires 120, as illustrated in FIG. 1. Each of the bonding wires 120 may include metal such as gold (Au), silver (Ag) and/or copper (Cu). A molding member 150 may be disposed on a top surface 100a of the package substrate 100 to cover the semiconductor chip 110 and the bonding wires 120. The molding member 150 may include epoxy molding compound (EMC). The molding member 150 may physically or chemically protect the semiconductor chip 110 and the package substrate 100 from an external environment.

The adhesive member employed to fix the semiconductor chip to the package substrate may be initially provided in a state having flowability, for example, in a gel state or in a paste state. The flowable adhesive member could be not maintained as a certain formal shape unless curing the adhesive. The adhesive may be coated on the package substrate without any fixing member such as a dam and the coated adhesive may spread out laterally due to the gravity. As a result, the adhesive member may have a non-uniform thickness. An edge thickness of the adhesive member may be thinner than a central thickness of the adhesive member. If a semiconductor chip may be mounted on the package substrate with an adhesive member having non-uniform thickness, a stress may be concentrated on contact points of the semiconductor chip, the adhesive and the molding member. The stress may initiate chip cracks or package substrate cracks. The cracks may affect the reliability of the semiconductor package.

According to various embodiments, the tension supplement patterns 125 may be disposed on edges of the second surface 110b of the semiconductor chip 110 and may be vertically aligned with the sidewalls 110c of the semiconductor chip 110. A distance between the semiconductor chip and the package substrate without the tension supplement patterns is greater than a distance between the tension supplement patterns 125 and the package substrate 100. Accordingly, if the tension supplement patterns 125 are introduced, a surface extension may affect the adhesive member 130 more strongly than the gravity. When the semiconductor chip 110 having the tension supplement patterns 125 is in contact with and attached to the adhesive member 130, a surface area of the adhesive member 130 between the tension supplement patterns 125 and the package substrate 100 tends to be minimized due to the surface tension. The surface area of the adhesive member between the second surface of the semiconductor chip and the top surface of the package substrate without the tension supplement patterns may be larger than the present embodiment. Thus, the adhesive member may readily to spread laterally and the slope of the boundary surface became smaller without the tension supplement patterns.

The tension supplement patterns 125 may additionally increase a contact area between the semiconductor chip 110 including the tension supplement patterns 125 and the adhesive member 130. Accordingly, a surface tension at an interface between the semiconductor chip 110 including the tension supplement patterns 125 and the adhesive member 130 may increase to relieve or suppress a phenomenon that the adhesive member 130 laterally spreads toward edges of the package substrate 100. As a result, an amount of the adhesive member 130 between the semiconductor chip 110 and the package substrate 100 may be maximized to improve the reliability of the semiconductor package.

The tension supplement patterns 125 disposed on edges of the second surface 110b of the semiconductor chip 110 may act as a frame that increases a surface tension of the adhesive member 130, thereby suppressing the lateral spread of the adhesive member 130. As a result, sidewalls of the adhesive member 130 may maintain a steep slope. Accordingly, the adhesive member 130 may have a uniform thickness. The tension supplement patterns 127, 155 and 160 illustrated in FIGS. 3, 4A and 4B may have substantially the same function as the tension supplement patterns 125.

Referring to FIGS. 5A to 7B, plan views and cross-sectional views illustrating semiconductor packages according to some modified embodiments are illustrated.

Figure 5A:
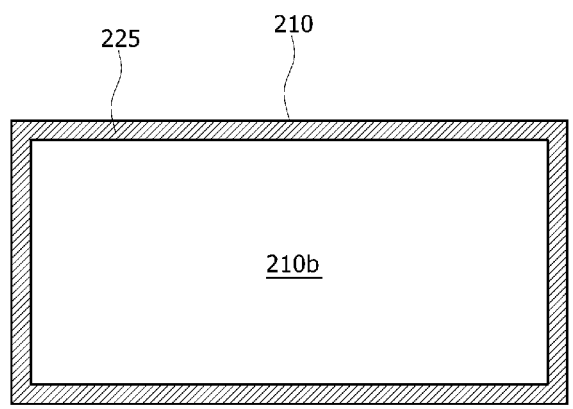
FIGS. 5A to 7B are plan views and cross-sectional views illustrating semiconductor packages according to some modified embodiments.
Figure 5B:
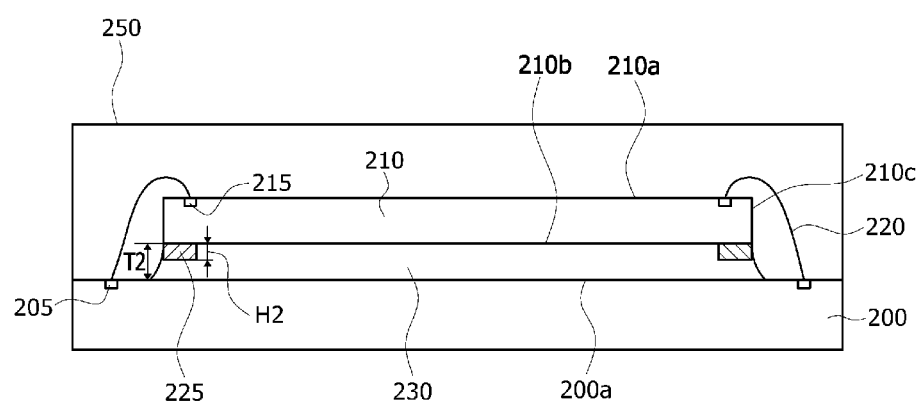

In FIGS. 5A and 5B, a semiconductor package according to a modified embodiment may include a package substrate 200, a semiconductor chip 210 disposed on the package substrate 200, and an adhesive member 230 disposed between the package substrate 200 and the semiconductor chip 210.

The package substrate 200 may be a PCB including a plurality of circuit interconnection patterns disposed therein. In addition, substrate pads 205 may be disposed on a top surface 200a of the package substrate 200. The semiconductor chip 210 may be mounted on the package substrate 200. The semiconductor chip 210 may have a first surface 210a corresponding to a front-side surface and a second surface 210b facing the first surface 210a to correspond to a backside surface.

A plurality of connection pads 215 may be disposed on the first surface 210a of the semiconductor chip 210. The connection pads 215 may be disposed on edges or a central portion of the semiconductor chip 210. Each of the connection pads 215 may include an aluminum (Al) material or a copper (Cu) material. The adhesive member 230 may be disposed between the package substrate 200 and the semiconductor chip 210 to fix the semiconductor chip 210 to the package substrate 200. The adhesive member 230 may include silicone resin or an epoxy resin. The adhesive member 230 may be formed so that a top surface area of the adhesive member 230 is less than a bottom surface area of the adhesive member 230. The adhesive member 230 may be formed to have a cross-sectional view which is similar to a trapezoid shape.

A tension supplement pattern 225 may be disposed on the second surface 210b of the semiconductor chip 210. The tension supplement pattern 225 may be disposed to protrude from the second surface 210b of the semiconductor chip 210. Referring again to FIG. 5A, the tension supplement pattern 225 may be continuously disposed along four edges of the semiconductor chip 210 to have a line shape. The tension supplement pattern 225 may have a rectangular closed loop shape in a plan view. However, the invention is not limited to the modified embodiment illustrated in FIG. 5A. For example, in some embodiments, the tension supplement pattern 225 may include two separate line-shaped tension supplement patterns which are disposed on two opposite edges of the semiconductor chip 210, respectively. The tension supplement pattern 225 may be formed to have a second height H2 from the second surface 210b of the semiconductor chip 210 and the adhesive member 230 may be formed to have a second thickness T2. In such a case, the second height H2 may be less than the second thickness T2 so that the tension supplement pattern 225 does not contact the top surface 200a of the package substrate 200. The tension supplement pattern 225 may be disposed to be vertically aligned with sidewalls 210c of the semiconductor chip 210.

The semiconductor chip 210 may be electrically coupled to the package substrate 200 through bonding wires 220. Each of the bonding wires 220 may include metal such as gold (Au), silver (Ag) and/or copper (Cu). A molding member 250 may be disposed on the top surface 200a of the package substrate 200 to cover the semiconductor chip 210 and the bonding wires 220. The molding member 250 may include epoxy molding compound (EMC). The molding member 250 may physically or chemically protect the semiconductor chip 210 and the package substrate 200 from an external environment.

Figure 6A:
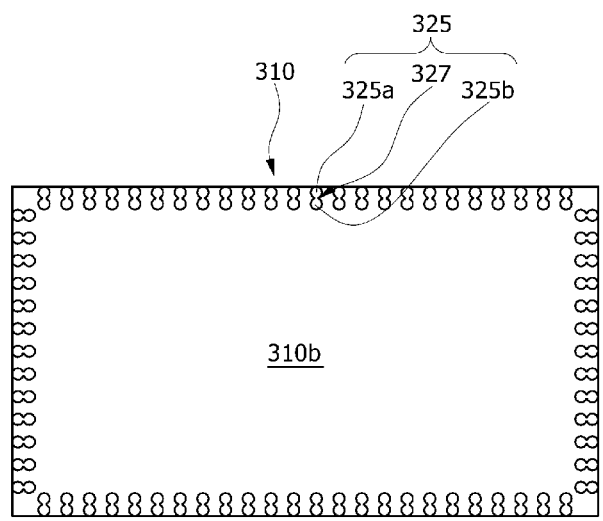
Figure 6B:
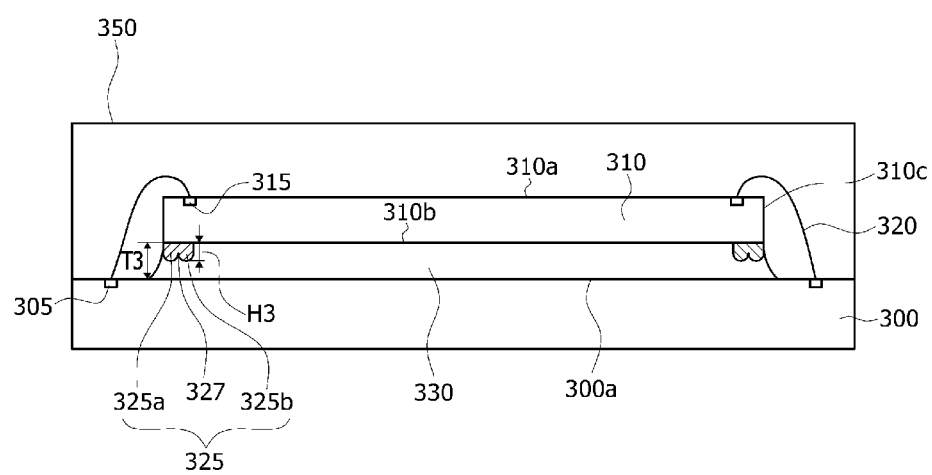

In FIGS. 6A and 6B, a semiconductor package according to a modified embodiment may include a package substrate 300, a semiconductor chip 310 disposed on the package substrate 300, and an adhesive member 330 disposed between the package substrate 300 and the semiconductor chip 310.

The package substrate 300 may be a PCB including a plurality of circuit interconnection patterns disposed therein. Further, substrate pads 305 may be disposed on a top surface 300a of the package substrate 300. The semiconductor chip 310 may be attached to the package substrate 300 using the adhesive agent 330 disposed between the semiconductor chip 310 and the package substrate 300. The semiconductor chip 310 may have a first surface 310a corresponding to a front-side surface and a second surface 310b facing the first surface 310a to correspond to a backside surface.

A plurality of connection pads 315 may be disposed on the first surface 310a of the semiconductor chip 310. The connection pads 315 may be disposed on edges or a central portion of the semiconductor chip 310. Each of the connection pads 315 may include aluminum (Al) or copper (Cu). The adhesive member 330 may be disposed between the package substrate 300 and the semiconductor chip 310 to fix the semiconductor chip 310 to the package substrate 300. The adhesive member 330 may be formed by coating an adhesive material having a gel state or a paste state on the package substrate 310 and curing the adhesive material. During the adhesive member forming process, the adhesive material having a gel state or a paste state may spread toward the edges of the package substrate 300 due to the gravity. As a result, a lower edge of the adhesive member 330 may laterally extend toward the edges of the package substrate 300 more than an upper edge of the adhesive member 330. A lower width of the adhesive member 330 may be greater than a width of the semiconductor chip 310. In such a case, a top surface area of the adhesive member 330 may be less than a bottom surface area of the adhesive member 330. Accordingly, the adhesive member 330 may be formed to have a cross-sectional view similar to a trapezoid shape. The adhesive member 330 may include silicone resin or epoxy resin.

Tension supplement patterns 325 including a polymer material may be disposed on the second surface 310b of the semiconductor chip 310. The tension supplement patterns 325 may be disposed to protrude from the second surface 310b of the semiconductor chip 310. Each of the tension supplement patterns 325 may include an outer protrusion 325a adjacent to one of sidewalls 310c of the semiconductor chip 310 and an inner protrusion 325b contacting an inner sidewall of the outer protrusion 325a. Each of the outer protrusion 325a and the inner protrusion 325b may have a hemispherical shape. In such a case, a concave groove 327 may be provided between the outer protrusion 325a and the inner protrusion 325b. Referring again to FIG. 6A, the plurality of tension supplement patterns 325 may be arrayed along four edges of the semiconductor chip 310. However, the invention is not limited to the modified embodiment illustrated in FIG. 6A. For example, in some embodiments, the plurality of tension supplement patterns 325 may be selectively disposed on two opposite edges of the semiconductor chip 310.

The tension supplement patterns 325 may be formed to have a third height H3 from the second surface 310b of the semiconductor chip 310 and the adhesive member 330 may be formed to have a third thickness T3. In such a case, the third height H3 may be less than the third thickness T3 so that the tension supplement patterns 325 do not contact the top surface 300a of the package substrate 300. The tension supplement patterns 325 may be disposed to be vertically aligned with the sidewalls 310c of the semiconductor chip 310. The semiconductor chip 310 may be electrically coupled to the package substrate 300 through bonding wires 320. Each of the bonding wires 320 may include metal such as gold (Au), silver (Ag) and/or copper (Cu). A molding member 350 may be disposed on the top surface 300a of the package substrate 300 to cover the semiconductor chip 310 and the bonding wires 320. The molding member 350 may include epoxy molding compound (EMC). The molding member 350 may physically or chemically protect the semiconductor chip 310 and the package substrate 300 from an external environment.

Referring again to FIGS. 7A and 7B, a semiconductor package according a modified embodiment may include a package substrate 400, a semiconductor chip 410 disposed on the package substrate 400 and configured to include a tension supplement pattern 425 attached to a surface thereof, and an adhesive member 430 disposed between the package substrate 400 and the semiconductor chip 410 to attach the semiconductor chip 410 to the package substrate 400.

The package substrate 400 may be a PCB including a plurality of circuit interconnection patterns disposed therein. In addition, a plurality of substrate pads 405 may be disposed on a top surface 400a of the package substrate 400. The semiconductor chip 410 may be mounted on the top surface 400a of the package substrate 400. The semiconductor chip 410 may have a first surface 410a corresponding to a front-side surface and a second surface 410b facing the first surface 410a to correspond to a backside surface.

A plurality of connection pads 415 may be disposed on the first surface 410a of the semiconductor chip 410. The connection pads 415 may be disposed on edges or a central portion of the semiconductor chip 410. Each of the connection pads 415 may include aluminum (Al) or copper (Cu). The adhesive member 430 disposed between the package substrate 400 and the semiconductor chip 410 may fix the semiconductor chip 410 to the package substrate 400. The adhesive member 430 may include silicone resin or epoxy resin. The adhesive member 430 may be formed so that a top surface area of the adhesive member 430 is less than a bottom surface area of the adhesive member 430. Accordingly, the adhesive member 430 may be formed to have a cross-sectional view similar to a trapezoid shape.

The tension supplement pattern 425 may be disposed on the second surface 410b of the semiconductor chip 410. The tension supplement pattern 425 may be disposed to protrude from the second surface 410b of the semiconductor chip 410. Referring again to FIG. 7A, the tension supplement pattern 425 may be continuously disposed along four edges of the semiconductor chip 410 to have a rectangular closed loop shape in a plan view. More specifically, the tension supplement pattern 425 may include an outer protrusion 429a having a rectangular closed loop shape, an inner protrusion 429b having a rectangular closed loop shape, and a trench 427 between the outer protrusion 429a and the inner protrusion 429b. The outer protrusion 429a may be physically connected to the inner protrusion 429b through a base portion of the trench 427. The trench 427 may be defined by both sidewalls and a bottom surface. Accordingly, the tension supplement pattern 425 may have an uneven surface due to the outer and inner protrusions 429a and 429b and the trench 427.

Figure 7A:
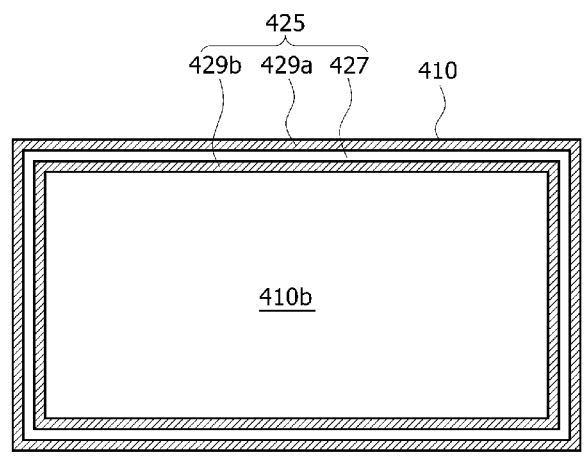
Figure 7B:
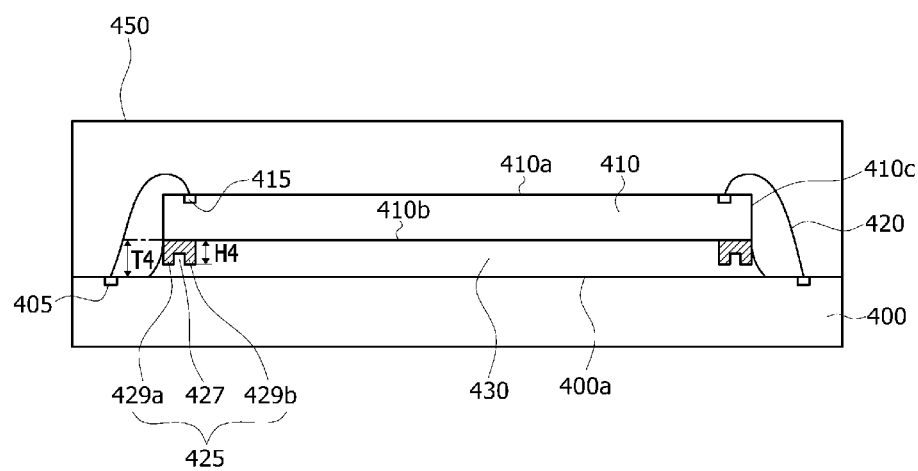

As illustrated in FIG. 7A, the tension supplement pattern 425 may be continuously disposed along four edges of the second surface 410b of the semiconductor chip 410, but the invention is not limited thereto. For example, in some embodiments, the tension supplement pattern 425 may include two separate line-shaped tension supplement patterns disposed on two opposite edges of the semiconductor chip 410, respectively. In such a case, each of the pair of separate line-shaped tension supplement patterns may include a line-shaped outer protrusion, a line-shaped inner protrusion, and a trench between the line-shaped outer protrusion and the line-shaped inner protrusion.

The tension supplement pattern 425 may be formed to have a fourth height H4 from the second surface 410b of the semiconductor chip 410. In addition, the adhesive member 430 may be formed to have a fourth thickness T4. In such a case, the fourth height H4 may be less than the fourth thickness T4 so that the tension supplement pattern 425 does not contact the top surface 400a of the package substrate 400. The tension supplement pattern 425 may be disposed to be vertically aligned with sidewalls 410c of the semiconductor chip 410.

The semiconductor chip 410 may be electrically coupled to the package substrate 400 through bonding wires 420. Each of the bonding wires 420 may include metal such as gold (Au), silver (Ag) and/or copper (Cu). A molding member 450 may be disposed on the top surface 400a of the package substrate 400 to cover the semiconductor chip 410 and the bonding wires 420. The molding member 450 may include an epoxy molding compound (EMC). The molding member 450 may physically or chemically protect the semiconductor chip 410 and the package substrate 400 from an external environment.

Referring to FIGS. 8 to 12, cross-sectional views illustrating a method of manufacturing a semiconductor package according to an embodiment are illustrated.

Figure 8:
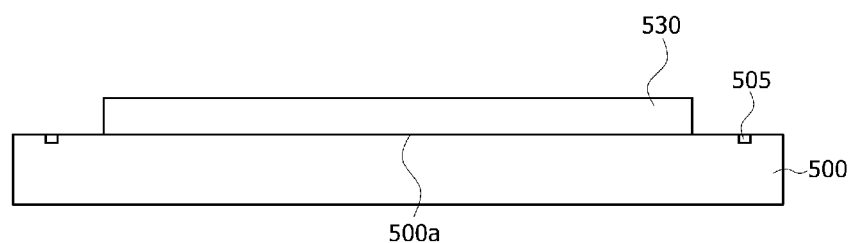
FIGS. 8 to 12 are cross-sectional views illustrating a method of manufacturing a semiconductor package according to an embodiment.
Figure 9:
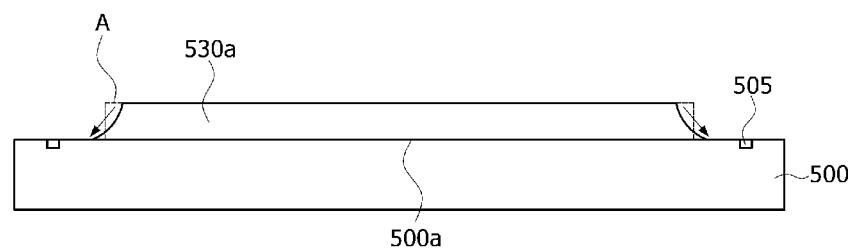

In FIGS. 8 and 9, an adhesive material 530 having a flowability may be coated on a package substrate 500. The package substrate 500 may be a substrate on which a semiconductor chip is mounted. In some embodiments, the package substrate 500 may include a PCB. The package substrate 500 may include substrate pads 505 that are disposed on a top surface 500a thereof. The substrate pads 505 may be arrayed on edges of the package substrate 500 to be spaced apart from each other, but not limited thereto. The package substrate 500 may be formed to include circuit interconnection patterns disposed therein. The adhesive material 530 may have a gel state or a paste state. In some embodiments, the adhesive material 530 may be formed of silicone resin or epoxy resin. The adhesive material 530 may be coated on a predetermined region having substantially the same area as a semiconductor chip which is attached in a subsequent process.

Since the adhesive material 530 has a flowability, it may be difficult to maintain a certain shape. More specifically, as illustrated in FIG. 8, the adhesive material 530 may be coated on the top surface 500a of the package substrate 500 without any partitions disposed on the package substrate 500. Thus, as the time elapses, the adhesive material 530 may spread in a lateral direction (see an arrow of FIG. 9) due to the gravity. Accordingly, the adhesive material 530 may be modified from an initial shape indicated by 'A' to provide a modified adhesive material 530a. Therefore, edge portions of the modified adhesive material 530a may become thinner than a central portion of the modified adhesive material 530a. A thickness of the edge portions of the modified adhesive material 530a may be less than a thickness of the central portion of the modified adhesive material 530a. In such a case, if a semiconductor chip is attached to the package substrate 500 on the modified adhesive material 530a, the edge portions of the modified adhesive material 530a may not be fully adhered to the semiconductor chip to exhibit a poor adhesion (i.e., an empty space or a void) between the semiconductor chip and modified adhesive material 530a. If the empty space between the semiconductor chip and the modified adhesive material 530a is filled with a molding member in a subsequent process, a triple point that three different materials (i.e., the semiconductor chip, the modified adhesive material, and the molding member) are contact each other may be provided. Since thermal expansion coefficients of the semiconductor chip, the modified adhesive material 530a, and the molding member are different from each other, a stress may be concentrated at the triple point to cause a warpage phenomenon of the semiconductor package. The warpage of the semiconductor package may cause cracks of the semiconductor chip 510 or the package substrate 500. Accordingly, because the triple point may directly affect the reliability of the semiconductor package, it may be necessary to prevent the triple point being formed. Thus, it is necessary to inhibit the adhesive material 530 from being modified and to maximize a contact area between the semiconductor chip and the modified adhesive material 530a.

Figure 10:
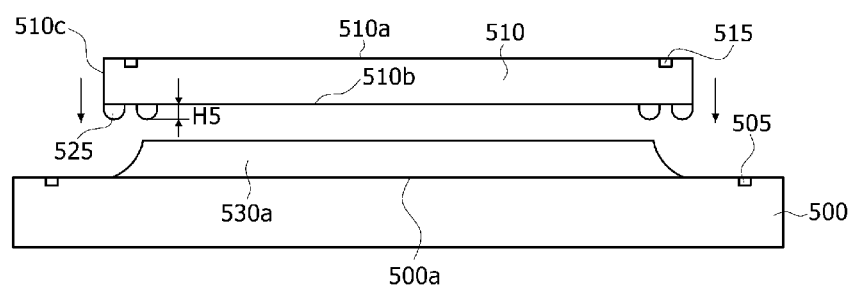

Referring to FIG. 10, a semiconductor chip 510 may be disposed on the modified adhesive material 530a coated on the package substrate 500. The semiconductor chip 510 may have a first surface 510a and a second surface 510b facing the first surface 510a. In some embodiments, the semiconductor chip 510 may have active regions adjacent to the first surface 510a. Thus, the first surface 510a may correspond to a front-side surface adjacent to the active regions. In addition, the second surface 510b may correspond to a backside surface. The semiconductor chip 510 may be disposed on the package substrate 500 so that the second surface 510b of the semiconductor chip 510 faces the top surface 500a of the package substrate 500.

A plurality of connection pads 515 may be disposed on the first surface 510a of the semiconductor chip 510. The connection pads 515 may electrically couple the semiconductor chip 510 to the package substrate 500. The connection pads 515 may be formed of metal such as aluminum (Al) or copper (Au). Although FIG. 10 illustrates an example in which the connection pads 515 are disposed on edges of the semiconductor chip 510, the invention is not limited to FIG. 10. For example, in some embodiments, the connection pads 515 may be disposed on a central portion of the semiconductor chip 510.

Tension supplement patterns 525 may be disposed on the second surface 510b (i.e., the backside surface) of the semiconductor chip 510. The tension supplement patterns 525 may be disposed along edges of the semiconductor chip 510. The tension supplement patterns 525 may be formed to protrude from the second surface 510b of the semiconductor chip 510 by a predetermined height H5. In some embodiments, each of the tension supplement patterns 525 may be formed to have a hemispherical shape. The tension supplement patterns 525 may be arrayed in a single line or in two lines along four edges of the second surface 510b of the semiconductor chip 510, but limited thereto. For example, in some embodiments, the tension supplement patterns 525 may be arrayed on only two opposite edges of the second surface 510b of the semiconductor chip 510, as described with reference to FIGS. 4A and 4B. The tension supplement patterns 525 may be formed to include a polymer material. In some embodiments, tension supplement patterns 525 may be formed to include the same material (i.e., silicone resin or an epoxy resin) as the modified adhesive material 530a. Further, the predetermined height H5 may be less than a thickness of the adhesive material 530a.

Although the embodiment is described in conjunction with an example in which each of the tension supplement patterns 525 is formed to have a hemispherical shape, the invention is not limited thereto. For example, in some embodiments, the tension supplement patterns 225, 325 or 425 illustrated in FIG. 5, 6 or 7 instead of the tension supplement patterns 525 may be formed on the second surface 510b of the semiconductor chip 510. The tension supplement patterns 525 may be arrayed along the edges of the semiconductor chip 510 and may be disposed to be vertically aligned with sidewalls 510c of the semiconductor chip 510.

Figure 11:
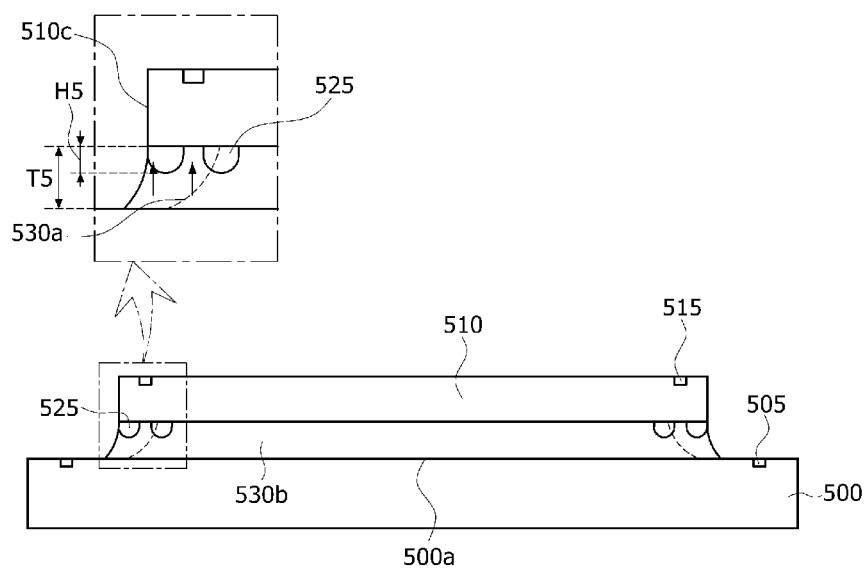

Subsequently, the semiconductor chip 510 may be moved down, as indicated by an arrow. In such a case, as illustrated in FIG. 11, the semiconductor chip 510 including the tension supplement patterns 525 may be attached to the package substrate 500 by the modified adhesive material 530a. If the semiconductor chip 510 is moved down toward the package substrate 500, the tension supplement patterns 525 may contact the edges of the modified adhesive material 530a. As the tension supplement patterns 525 contact the edges of the modified adhesive material 530a, the edges of the modified adhesive material 530a may be pulled up toward the semiconductor chip 510 by a surface extension of the modified adhesive material 530a (see arrows in an enlarged view of FIG. 11). Accordingly, the edges of the modified adhesive material 530a may fully contact the semiconductor chip 510. There may be no void provided between the modified adhesive material 530a and the second surface 510b of the semiconductor chip 510. The modified adhesive material 530a fully contacting the semiconductor chip 510 may then be cured by heat or ultraviolet rays to form an adhesive member 530b fixing the semiconductor chip 510 to the package substrate 500. As a result, the adhesive member 530b may have a uniform thickness throughout an entire portion contacting the semiconductor chip 510. The tension supplement patterns 525 may have a height H5 which is less than a thickness T5 of the adhesive member 530b so that the tension supplement patterns 525 do not contact the package substrate 500.

Figure 12:
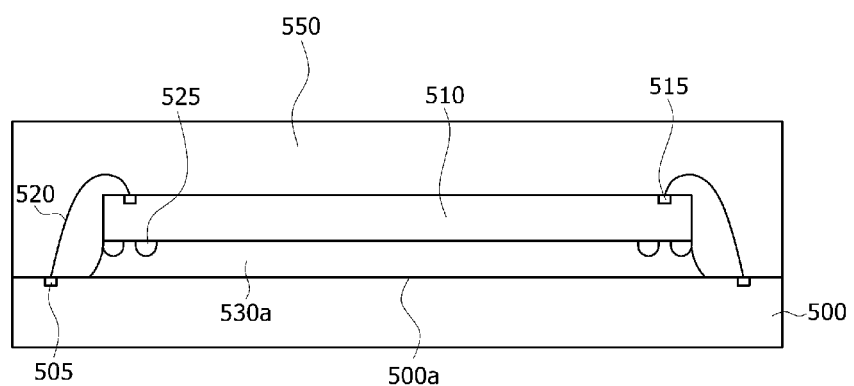

Referring to FIG. 12, bonding wires 520 may be formed to electrically couple the connection pads 515 of the semiconductor chip 510 to the substrate pads 505 of the package substrate 500. The bonding wires 520 may be formed of a metal such as gold (Au), silver (Ag) and/or copper (Cu). The bonding wires 520 may be formed using a wire bonding process.

Subsequently, a molding member 550 may be formed on the package substrate 500 to cover the semiconductor chip 510 and the bonding wires 520. The molding member 550 may be formed to include EMC.

According to an embodiment, an adhesive member for attaching a semiconductor chip to a package substrate may be formed to have substantially the same width as the semiconductor chip using tension supplement patterns attached to the semiconductor chip. Accordingly, a surface area of the exposed portion of the adhesive member may be minimized to suppress the moisture absorption of the adhesive member and to improve the reliability of a semiconductor package including the semiconductor chip.

The semiconductor packages described above may be applied to various electronic systems.

Figure 13:
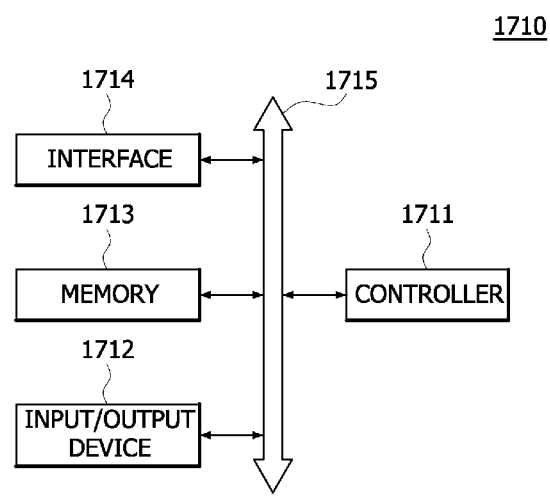
FIG. 13 is a block diagram illustrating an electronic system including a semiconductor package in accordance with an embodiment.

Referring to FIG. 13, the semiconductor package in accordance with an embodiment may be applied to an electronic system 1710. An electronic system 1710 may include a controller 1711, an input/output unit 1712, and a memory 1713. The controller 1711, the input/output unit 1712, and the memory 1713 may be electrically coupled with one another through a bus 1715 providing a path through which data move.

For example, the controller 1711 may include at least any one of at least one microprocessor, at least one digital signal processor, at least one microcontroller, and logic devices capable of performing the same functions as these components. At least one of the controller 1711 and the memory 1713 may include at least any one of the semiconductor packages according to the embodiments of the invention. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be employed in an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 configured to transmit and receive data to and from a communication network. The interface 714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDAM (wideband code division multiple access), CDMA2000, LTE (long term evolution) and Wibro (wireless broadband Internet).

Figure 14:
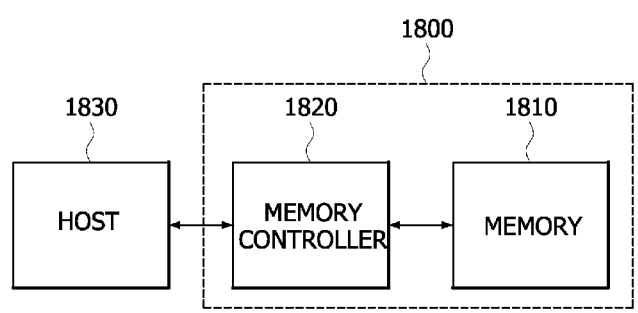
FIG. 14 is a block diagram illustrating another electronic system employing a memory card including a semiconductor package in accordance with an embodiment.

Referring to FIG. 14, the semiconductor package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the invention is applied. The memory controller 1820 may control the memory 1810 such that stored data is read out or data is stored in response to a read/write request from a host 1830.

The embodiments of the invention have been disclosed above for illustrative purposes. Those of ordinary skill in the art will appreciate that various modifications, additions, and substitutions are possible, without departing from the scope and spirit of the invention as disclosed in the accompanying claims.

What is claimed is:

1. A semiconductor package comprising:
an adhesive member disposed on a package substrate to have a trapezoid cross-section view; and
a semiconductor chip disposed on the adhesive member and attached to the package substrate by the adhesive member,
wherein the semiconductor chip has a first surface and a second surface facing the first surface,
wherein the second surface of the semiconductor chip contacts the adhesive member, and
wherein the semiconductor chip includes a tension supplement pattern attached to the second surface and spaced apart from the package substrate, wherein the tension supplement pattern includes a plurality of tension supplement patterns arrayed on two opposite edges of the semiconductor chip.

2. The semiconductor package of claim 1, wherein the adhesive member includes silicone resin or epoxy resin.

3. The semiconductor package of claim 1, wherein a top surface area of the adhesive member is less than a bottom surface area of the adhesive member.

4. The semiconductor package of claim 1,
wherein the first surface of the semiconductor chip corresponds to a front-side surface adjacent to active regions; and
wherein the second surface of the semiconductor chip corresponds to a backside surface that faces the first surface.

5. The semiconductor package of claim 1, wherein the tension supplement pattern is disposed along edges of the semiconductor chip.

6. The semiconductor package of claim 1,
wherein the tension supplement pattern includes a plurality of tension supplement patterns arrayed along four edges of the semiconductor chip including two opposite edges of the semiconductor chip; and
wherein the plurality of tension supplement patterns are arrayed in a single line or in two lines.

7. The semiconductor package of claim 1,
wherein the tension supplement pattern includes a polymer material; and
wherein the polymer material is silicone resin or epoxy resin.

8. The semiconductor package of claim 1,
wherein the tension supplement pattern protrudes from the second surface of the semiconductor chip to have a predetermined height; and
wherein the predetermined height of the tension supplement pattern is less than a thickness of the adhesive member so that the tension supplement pattern is spaced apart from the package substrate.

9. The semiconductor package of claim 1, wherein the tension supplement pattern is disposed to be vertically aligned with sidewalls of the semiconductor chip.

10. The semiconductor package of claim 1,
wherein the tension supplement pattern includes a plurality of tension supplement patterns; and
wherein each of the plurality of tension supplement patterns protrudes from the second surface of the semiconductor chip to have a hemispherical shape.

11. The semiconductor package of claim 1,
wherein the tension supplement pattern includes a plurality of tension supplement patterns;
wherein each of the plurality of tension supplement patterns includes an outer hemispherical protrusion adjacent to any one of sidewalls of the semiconductor chip and an inner hemispherical protrusion contacting an inner sidewall of the outer hemispherical protrusion; and
wherein a concave groove is provided between the outer hemispherical protrusion and the inner hemispherical protrusion.

12. The semiconductor package of claim 1, wherein the tension supplement pattern is continuously disposed along four edges of the second surface of the semiconductor chip to have a closed loop shape in a plan view.

13. The semiconductor package of claim 1, wherein the tension supplement pattern includes two separate line-shaped tension supplement patterns disposed on two opposite edges of the second surface of the semiconductor chip.

14. The semiconductor package of claim 1, wherein the tension supplement pattern includes an outer protrusion disposed along four edges of the second surface of the semiconductor chip to have a rectangular closed loop shape, an inner protrusion disposed to be adjacent to an inner sidewall of the outer protrusion to have a rectangular closed loop shape, and a trench between the outer protrusion and the inner protrusion.

15. The semiconductor package of claim 14, wherein the trench is defined by sidewalls and a bottom surface recessed from the inner and outer protrusions.

16. The semiconductor package of claim 14, wherein the tension supplement pattern has an uneven surface due to the outer and inner protrusions and the trench.

17. The semiconductor package of claim 1,
wherein the tension supplement pattern includes a pair of separate line-shaped tension supplement patterns disposed on two opposite edges of the semiconductor chip; and
wherein each of the pair of separate line-shaped tension supplement patterns include a line-shaped outer protrusion, a line-shaped inner protrusion, and a trench between the line-shaped outer protrusion and the line-shaped inner protrusion.

18. A method of manufacturing a semiconductor package, the method comprising:
- coating an adhesive material having flowability on a package substrate;
- disposing a semiconductor chip above the coated adhesive material, the semiconductor chip having a first surface and a second surface facing the first surface and a tension supplement pattern attached to the second surface;
- bringing the tension supplement pattern into contact with the coated adhesive material to fill a space between the semiconductor chip and the package substrate with the coated adhesive material; and
- curing the coated adhesive material to fix the semiconductor chip to the package substrate.

19. An electronic system including a package, the package comprising:
- an adhesive member disposed on a package substrate to have a trapezoid cross-section view; and
- a semiconductor chip disposed on the adhesive member and attached to the package substrate by the adhesive member,
- wherein the semiconductor chip has a first surface and a second surface facing the first surface,
- wherein the second surface of the semiconductor chip contacts the adhesive member, and
- wherein the semiconductor chip includes a tension supplement pattern attached to the second surface and spaced apart from the package substrate, wherein the tension supplement pattern includes a plurality of tension supplement patterns arrayed on two opposite edges of the semiconductor chip.

* * * * *